United States Patent
Seo et al.

(10) Patent No.: US 11,818,841 B2
(45) Date of Patent: Nov. 14, 2023

(54) PRINTED CIRCUIT BOARD

(71) Applicant: SAMSUNG ELECTRO-MECHANICS CO., LTD., Suwon-si (KR)

(72) Inventors: Hae Kyo Seo, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/371,800

(22) Filed: Jul. 9, 2021

(65) Prior Publication Data

US 2022/0346230 A1 Oct. 27, 2022

(30) Foreign Application Priority Data

Apr. 26, 2021 (KR) .................. 10-2021-0053782

(51) Int. Cl.
*H05K 1/11* (2006.01)
*H05K 1/02* (2006.01)

(52) U.S. Cl.
CPC ........... *H05K 1/112* (2013.01); *H05K 1/0222* (2013.01); *H05K 1/115* (2013.01); *H05K 1/025* (2013.01); *H05K 1/0218* (2013.01); *H05K 1/111* (2013.01)

(58) Field of Classification Search
CPC .................................................. H05K 1/112
See application file for complete search history.

(56) References Cited

U.S. PATENT DOCUMENTS

| | | | | |
|---|---|---|---|---|
| 5,949,030 A | * | 9/1999 | Fasano | H05K 1/115 174/265 |
| 8,151,456 B2 | * | 4/2012 | Maehara | H05K 3/4602 174/262 |
| 2003/0085471 A1 | | 5/2003 | Ijima et al. | |
| 2007/0020914 A1 | * | 1/2007 | Higashi | H05K 1/115 257/E23.008 |
| 2010/0006330 A1 | * | 1/2010 | Fu | H01L 24/19 29/856 |
| 2011/0209905 A1 | * | 9/2011 | Morita | H05K 1/0222 174/257 |
| 2016/0135289 A1 | * | 5/2016 | Cho | H05K 1/115 174/251 |

FOREIGN PATENT DOCUMENTS

| | | |
|---|---|---|
| JP | 2001-352166 A | 12/2001 |
| JP | 2002-280737 A | 9/2002 |
| JP | 3495727 B2 | 2/2004 |

* cited by examiner

*Primary Examiner* — Ishwarbhai B Patel
(74) *Attorney, Agent, or Firm* — Morgan, Lewis & Bockius LLP

(57) ABSTRACT

The present disclosure relates to a printed circuit board. The printed circuit board includes a core layer; a through portion penetrating through the core layer; a first via disposed to be spaced apart from an inner wall of the through portion within the through portion; and a second via disposed in the first via and having a diameter different from that of the first via.

21 Claims, 8 Drawing Sheets

PRINTED CIRCUIT BOARD

CROSS-REFERENCE TO RELATED APPLICATION(S)

This application claims benefit of priority to Korean Patent Application No. 10-2021-0053782 filed on Apr. 26, 2021 in the Korean Intellectual Property Office, the disclosure of which is incorporated herein by reference in its entirety.

TECHNICAL FIELD

The present disclosure relates to a printed circuit board, in particular, to a printed circuit board having a via member embedded therein.

BACKGROUND

Vias are disposed for connection between conductors in the printed circuit board. There are three types of vias, each serving to connect a signal line, a ground line, and a power line, respectively. In this case, when the via connecting the ground does not completely cover a periphery of the via connecting the signal line, signal loss may occur, and in order to prevent this, a via member including a coaxial via having different diameters may be used.

In general, a through-via of the core layer having a thick thickness may be difficult to use to perform a function of connecting signal lines. To improve this, provided is a coaxial via structure, but this may be difficult to mass-produce. In order to overcome this, a printed circuit board having a structure in which a coaxial via is formed separately, as a separate member, and inserted thereinto, is required.

SUMMARY

An aspect of the present disclosure is to provide a printed circuit board having improved signal quality.

Another aspect of the present disclosure is to provide a printed circuit board, advantageous for impedance matching.

Another aspect of the present disclosure is to provide a printed circuit board capable of preventing signal loss in a core layer.

Another aspect of the present disclosure is to provide a printed circuit board in which a degree of design freedom is secured.

One of the various solutions proposed through the present disclosure is to provide a printed circuit board including a coaxial via having different diameters in a core layer. In this case, the coaxial via having different diameters is separately manufactured as a via member and then embedded in the core layer through a process of insertion thereof into the through-hole of the printed circuit board, thereby securing a further degree of freedom of the process and preventing design defects.

For example, according to an example, a printed circuit board may include a core layer; a through-hole passing through the core layer; a first via disposed to be spaced apart from an inner wall of the through-hole within the through-hole; and a second via disposed within the first via and having a diameter, different from that of the first via.

Alternatively, according to an example, a printed circuit board may include a core layer; a through-hole passing through the core layer; a via member disposed within the through-hole; and an insulating material disposed in at least a portion of the through-hole and disposed between an inner wall of the through-hole and the via member.

Alternatively, according to an example, a printed circuit board may include an insulating layer; a through portion penetrating through the insulating layer; a first via disposed in the through portion and spaced apart from the insulating layer by an insulating material; and a second via disposed in the first via and spaced apart from the first via by a dielectric material.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
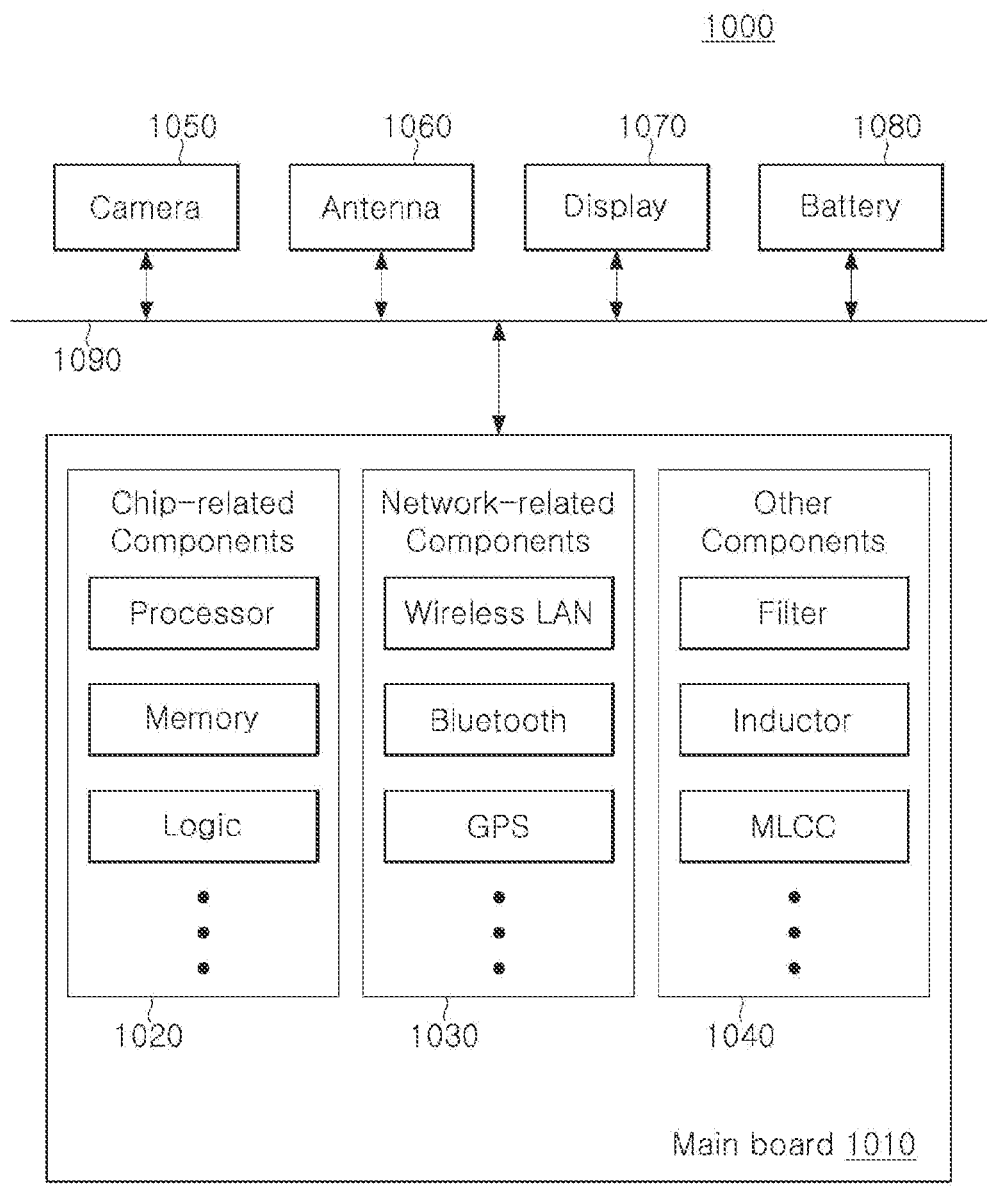
FIG. 1 is a block diagram schematically illustrating an example of an electronic device system.

Hereinafter, the present disclosure will be described with reference to the accompanying drawings. Shapes and dimensions of the elements in the drawings may be exaggerated or reduced for greater clarity of description.

FIG. 1 is a block diagram schematically illustrating an example of an electronic device system.

Referring to FIG. 1, an electronic device 1000 may accommodate a motherboard 1010. The motherboard 1010 may include chip-related components 1020, network-related components 1030, other components 1040, or the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a amass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
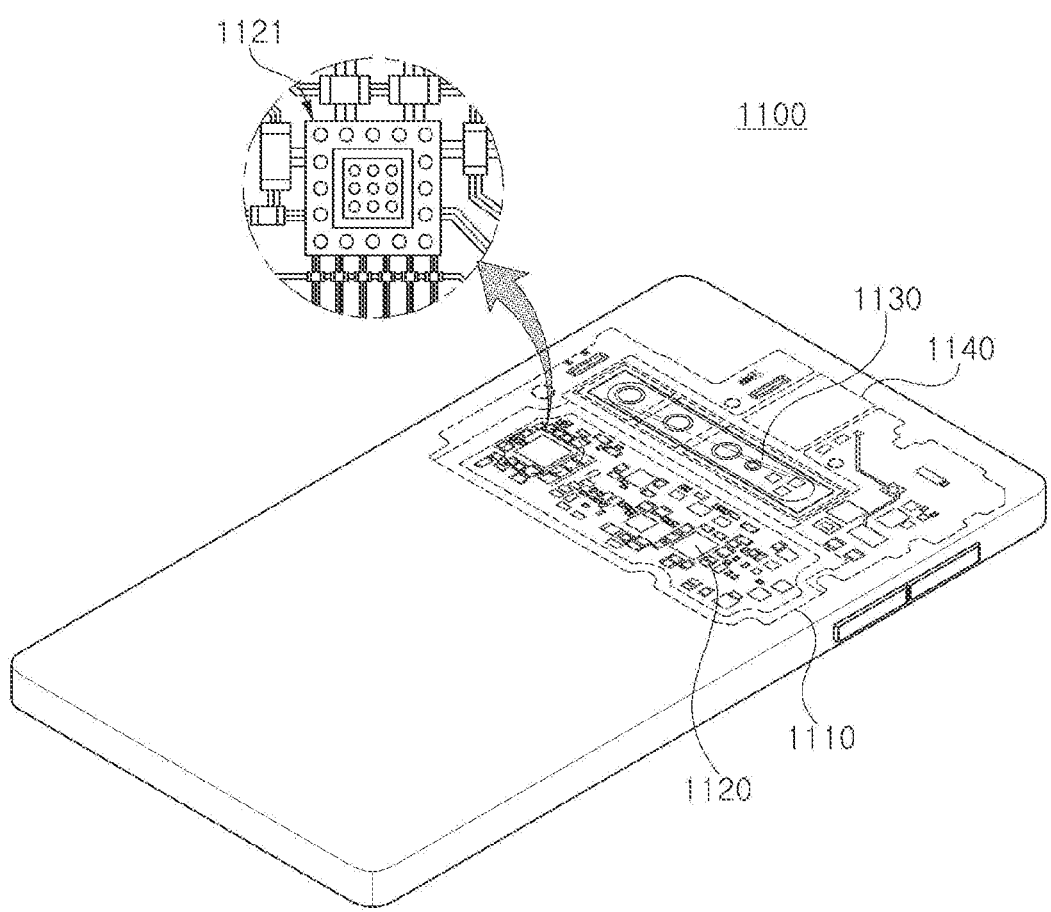
FIG. 2 is a perspective view schematically illustrating an example of an electronic device.

FIG. 2 is a perspective view schematically illustrating an example of an electronic device.

Referring to FIG. 2, the electronic device may be a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. Some of the components 1120 may be the chip related components, such as a component package 1121, for example, but an example embodiment thereof is not limited thereto. The electronic device is not necessarily limited to the smartphone 1100, and may be other electronic devices as described above.

Figure 3:
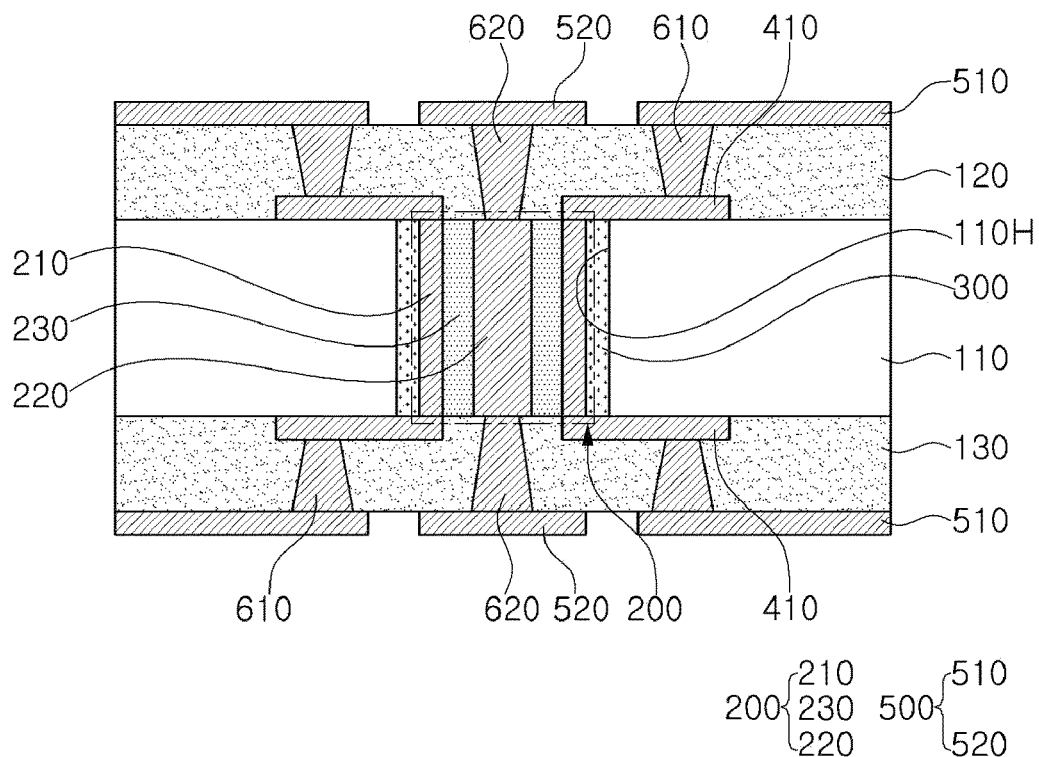
FIG. 3 is a cross-sectional view schematically illustrating an example of a printed circuit board.

FIG. 3 is a cross-sectional view illustrating an example of a printed circuit board.

Referring to FIG. 3, a printed circuit board 100A according to an example includes: a core layer 110 having a through portion 110H, a via member 200 including first and second vias 210 and 220 disposed in the through portion 110H, and having diameters different from each other and a dielectric material 230 disposed between the first and second vias 210 and 220, an insulating material 300 filling at least a portion of the through-hole 110H, and covering at least a portion of the via member 200, a first via pad 410 disposed on the core layer 110, and connected to the first via 210, first and second insulating layers 120 and 130 disposed on the core layer 110, and covering the via member 200 and the first via pad 410, a circuit pattern 500 disposed on the first and second insulating layers 120 and 130, and including a ground pattern 510 and a signal pattern 520, a first wiring via 610 connecting the circuit pattern 500 to the first via pad 410, and a second wiring via 620 connecting the circuit pattern 500 to the second via 220.

For example, as in the process to be described later, the printed circuit board 100A according to an example may be manufactured by inserting a separately manufactured via member 200 after the through portion 110H is processed in the core layer 110. In this case, as a dielectric material 230 of the via member 200, since a material, different from that of the core layer 110 of the printed circuit board 100A may be used, an insulating material 300 filling the through portion 110H later can also use a material, different from those of the core layer 110 and the dielectric material 230, the material of the dielectric material 230 can be selected regardless of the material of the core layer 110 and the insulating material 300, Various materials can be selected as needed, which is advantageous in matching impedance between the via members 200.

Meanwhile, the via member 200 included in the printed circuit board 100A according to an example may be manufactured to have a coaxial via having different diameters. The coaxial via having different diameters may include a first via 210 and a second via 220 surrounding the first via 210 and having a smaller diameter than the first via 210, respectively. That is, the second via 220 may be disposed inside the first via 210. Compared to the process and structure of sequentially forming coaxial vias having different diameters in the through portion 110H of the core layer 110, in the printed circuit board 100A according to an example of the present disclosure, by separately manufacturing a coaxial via, the first via 210 having a greater diameter can completely surround the second via 220, thereby preventing signal loss from occurring.

Meanwhile, since the via member 200 included in the printed circuit board 100A according to example is separately manufactured and then inserted, it may be advantageous to improve a yield. As a specific example, when a process of sequentially forming coaxial vias having different diameters in the through portion 110H of the core layer 110 is performed, when a defect occurs during manufacturing, all precursors that have progressed up to the process have defects are difficult to be used. In the printed circuit board 100A according to an example of the present disclosure, since the via member 200 is manufactured separately from the core layer 110 of the printed circuit board 100A and then inserted into the through portion 110H, a yield when a defect occurs in the manufacturing process may be increased.

Meanwhile, since the via member 200 included in the printed circuit board 100A according to an example is separately manufactured and then inserted, compared to the process and structure of forming a coaxial via after generating a through-hole in a conventional core substrate, a defect of the via member 200 may be prevented and the via member 200 may be precisely processed. In the case of the core layer 110, compared to other insulating layers, the thickness of the core layer 110 is thicker due to the characteristic contributing to warpage reduction of an entire substrate. If the thickness is thick, defects may occur in through-hole processing and via plating. When the via member 200 is separately manufactured as in the present disclosure, defects can be reduced and signal loss can be prevented by manufacturing the via member 200 more precisely.

Meanwhile, since the via member 200 included in the printed circuit board 100A according to an example is separately manufactured and then inserted, the via member 200 may be disposed to be spaced apart from an inner wall of the through portion 110H of the core layer 110 by a predetermined distance, and an insulating material 300 may be formed between the inner wall of the through portion 110H and the via member 200. When a via is directly plated on the inner wall of the through portion 110H, an issue of adhesion between the insulating layers, such as a via plating material penetrating into a gap between the core layer 110 and the insulating layers 120 and 130 to generate cracks, may occur. However, in the printed circuit board 100A according to an example of the present disclosure, since inner wall of the through portion 110H and the via member 200 are disposed to be spaced apart from each other, this problem may be prevented. In addition, the insulating material 300 fills the through portion 110H in a fluid state as described later and then is cured through a curing process, so that the via member 200 can be effectively fixed in the through portion 110H.

Hereinafter, the components of the printed circuit board 100A according to an example will be described in more detail with reference to the drawings.

A core layer 110 may further improve rigidity of the printed circuit board 100A according to a specific material, and may perform a role such as securing thickness uniformity of the insulating material 300. The core layer 110 has a through portion 110H penetrating therethrough. The through portion 110H may be a closed space in which all four side portions are closed, but a discontinuous portion, for example, an externally open portion, may exist in some regions, if necessary. If necessary, a plurality of through portions 110H may exist, and the same or different via members 200 may be disposed in each thereof. The thickness of the core layer 110 may be thicker than the thickness of each of the first and second insulating layers 120 and 130. The thickness of the core layer 110 may be substantially the same as the thickness of the via member 200. Here, the meaning that the thickness is substantially the same does not only mean that the thickness is completely the same numerically, but also includes a case in which the thickness has a difference within an error range that may generally occur in the process. An insulating material may be used as a material of the core layer 110, and a thermosetting resin such as an epoxy resin or a thermoplastic resin such as polyimide may be used as the insulating material. In addition, those containing inorganic fillers such as silica and reinforcing materials such as glass fibers may be used in these resins. For example, a prepreg may be used, but is not limited thereto.

The via member 200 may include a plurality of vias having different diameters. As an example, although FIG. 3 illustrates a structure in which a plurality of vias have the first and second vias 210 and 220, it may have a larger number of vias. The first via 210 may have a shape surrounding the second via 220 while being spaced apart from the second via 220 by a predetermined distance, specifically may have a shape surrounding a side surface of the second via 220. In addition, the first and second vias 210 and 220 may also be coaxial. Here, the meaning that the first and second vias 210 and 220 are coaxial does not necessarily mean that the axes of the first and second vias 210 and 220 are exactly the same, but includes meaning that the second via 220 surrounds a side surface of the first via 210 within a range including a process error.

A dielectric material 230 may be disposed in a space in which the first and second vias 210 and 220 are spaced apart. The dielectric material 230 may cover at least a portion of a side surface of the second via 220. In the case of the via member 200, in the manufacturing process, according to the characteristic of the corresponding product, a dielectric material 230 having a dielectric constant (Dk) and a dielectric loss tangent (Df), suitable therefor, may be disposed between the first and second vias 210 and 220, and thus may be configured to include a material different from the core layer 110 and the first and second insulating layers 120 and 130 of the printed circuit board 100A. For this reason, in the case of the printed circuit board 100A according to the present disclosure, various materials may be included in the via member 200 according to needs and designs.

The first and second vias 210 and 200 may be a ground via and a signal via, respectively. In the case of the first via 210, a ground via, it may be connected to a ground pattern in the printed circuit board 100A to perform a ground function, and in the case of the second via 220, a signal via, it may be connected to a signal pattern in the printed circuit board 100A to perform a function of transmitting an electrical signal.

In a printed circuit board handling high-frequency signals, frequency characteristics in a signal transmission path may be a problem. In order to prevent signal reflection at input/output terminals, there is a method of matching characteristic impedances or shortening signal lines. In the case of the printed circuit board 100A according to the present disclosure, as a method of matching characteristic impedances, a structure in which the first and second vias 210 and 220 are made coplanar in a signal transmission path to form a via member 200 to have coaxial vias, and a dielectric material 230 having a specific dielectric constant and dielectric loss tangent is selectively formed between the first and second vias 210 and 220, is disclosed. Therefore, in the case of the printed circuit board 100A according to an example of the present disclosure, matching of characteristic impedance is possible due to the structure in which the first via 210 surrounds the side surface of the second via 220 and the structure in which the dielectric material 230 having a dielectric constant according to needs is formed between the first and second vias 210 and 220. In addition, by configuring the signal transmission path in a thickness direction between one surface and the other surface of the core layer 110 with a plurality of first and second vias 210 and 220 having a coaxial axis, the characteristic impedance may be uniform and continuous, so that the signal reflection phenomenon can be prevented. Accordingly, even if the substrate is multi-layered and thickened or an operating speed of a signal is increased, delay or malfunction due to signal reflection does not occur easily and signal transmission is possible accurately.

As a material of the first and second vias 210 and 220, a metal material may be used. As the metal material, copper (Cu), aluminum (Al), silver (Ag), tin (Sn), gold (Au), nickel (Ni), lead (Pb), titanium (Ti), or alloys thereof may be used. The first and second vias 210 and 220 may include a signal via, a ground via, a power via, and the like. As described above, the first via 210 may be a ground via, and the second via 220 may be a signal via. Each of vias of the first and second vias 210 and 220 may be completely filled with a via hole with a metal material, or metal material may be formed along a wall surface of the via hole. The first and second vias 210 and 220 may be formed by a plating process such as an additive process (AP), a semi AP (SAP), a modified SAP (MSAP), tenting (TT), and the like, and as a result, may include a seed layer, an electroless plating layer, and an electrolytic plating layer formed based on the seed layer. The second via 220 may have an hourglass shape in which a width becomes narrower toward a central portion in a thickness direction, but is not limited thereto.

In the case of the dielectric material 230, as described above, it may include a dielectric material, different from that of the core layer 110, the first and second insulating layers 120 and 130, and the insulating material 300, and as an example, may include a dielectric material such as silicon (Si), or the like, but is not limited thereto. That is, according to needs and product design and application fields, a material having a high dielectric constant or a low dielectric constant characteristic may be included, and a material having a high dielectric loss tangent or low dielectric loss tangent characteristic may also be included.

The insulating material 300 may fill at least a portion of the through-portion 110H of the core layer 110, and may cover at least a portion of the via member 200. Specifically, the insulating material 300 may cover a side surface of the via member 200, and for example, may be in physical contact with the first via 210 disposed outside the via member 200 and cover at least a portion of the side surface of the first via 210. As a material of the insulating material 300, an insulating material may be used. As the insulating material, a thermosetting resin such as an epoxy resin, a thermoplastic resin such as polyimide. In addition, those in which inorganic fillers, such as silica, are contained in these resins can also be used. For example, as the material of the insulating material 300, an ABF (Ajinomoto Build-up Film) may be used. The ABF may be provided in a RCC (Resin Coated Copper) form, but is not limited thereto. If necessary, a photosensitive material such as PID (Photo Image-able Dielectric) may be used.

The insulating material 300 may be filled in the through portion 110H in an uncured or semi-cured state and then cured through a curing process to stably fix the via member 200 in the through portion 110H.

The first via pad 410 may be disposed on one surface and the other surface of the core layer 110. The first via pad 410 may be in contact with the first via 210 and electrically connected to the first via 210. As described above, since the first via 210 surrounds a side surface of the second via 220, the first via 210 may have a cylindrical shape having an empty space therein. Accordingly, the first via 210 may have a small area in a horizontal direction, and may be difficult to electrically connect to other component. To compensate therefor, the first via pad 410 may perform a function of securing an area to which the first via 210 can be electrically connected to connect the first via 210 to other components. Since the first via pad 410 is connected to the first via 210, it may have a circular annular shape having an empty space in a center in a horizontal cross-section to correspond to the first via 210.

A metal material may be used as a material of the first via pad 410, and as the metal material, copper (Cu), aluminum (Al), silver (Ag), tin (Sn), gold (Au), nickel (Ni), lead (Pb), titanium (Ti), or an alloy thereof may be used.

As described above, when the first via 210 functions as a ground via, the first via pad 410 may be connected to a ground pattern through the first wiring via 610. The first via pad 410 may have a line, a plane, or a pad shape. The first via 210 may be formed by a plating process such as an additive process (AP), a semi AP (SAP), a modified SAP (MSAP), tenting (TT), and the like, and as a result, may include a seed layer, an electroless plating layer, and an electrolytic plating layer formed based on the seed layer. When the first and second insulating layers 120 and 130 are provided in a RCC form, the first via pad 410 may further include a metal foil such as a copper foil, and if necessary, a primer resin may be present on a surface of the metal foil.

The first and second insulating layer 120 and 130 may be disposed on one surface and the other surface of the core layer 110 to cover at least a portion of each of the first via pad 410 and the via member 200. As a material of the first and second insulating layers 120 and 130, an insulating material may be used, and as the insulating material, a thermosetting resin such as an epoxy resin, a thermoplastic resin such as polyimide. In addition, those containing inorganic fillers such as silica and reinforcing materials such as glass fibers may be used in these resins. For example, a prepreg may be used as a material of the first and second insulating layers 120 and 130, but is not limited thereto, and a material that does not include a reinforcing material such as glass fiber, for example, ABF, or the like may be used. If necessary, a photosensitive insulating material such as PID may be used. In the case of FIG. 3, only the first and second insulating layers 120 and 130 are illustrated, but a larger number of insulating layers may be stacked according to needs and designs.

The circuit pattern 500 may be disposed on the first and second insulating layers 120 and 130, and may include a ground pattern 510 and a signal pattern 520. The ground pattern 510 may be electrically connected to the first via pad 410 and the first via 210 through the first wiring via 610. The signal pattern 520 may be electrically connected to the second via 220 through the second wiring via 620.

As a material of the circuit pattern 500, a metal material may be used. As the metal material, copper (Cu), aluminum (Al), silver (Ag), tin (Sn), gold (Au), nickel (Ni), lead (Pb), titanium (Ti), or alloys thereof may be used. The circuit pattern 500 may perform various functions according to the design. For example, the circuit pattern 500 may include a ground pattern, a power pattern (not shown), a signal pattern 520, or the like. Each of the patterns may have a line, a plane, and/or a pad shape. The circuit pattern 500 may be formed by a plating process such as an additive process (AP), a semi AP (SAP), a modified SAP (MSAP), tenting (TT), and the like, and as a result, may include a seed layer, an electroless plating layer, and an electrolytic plating layer formed based on the seed layer. When RCC is used as the first and second insulating layers 120 and 130, a metal foil such as a copper foil may further be included on the lowermost side, and if necessary, a primer resin formed on a surface of the metal foil may further be included. In the case of FIG. 3, only the circuit patterns 500 disposed on the first and second insulating layers 120 and 130 are illustrated, but when a larger number of insulating layers are stacked according to needs and designs, a larger number of circuit patterns may be disposed.

The first and second wiring vias 610 and 620 may penetrate through the first and second insulating layers 120 and 130 to electrically connect the circuit pattern to the via member 200. For example, the first wiring via 610 may penetrate through the first and second insulating layers 120 and 130 and electrically connect the ground pattern 510 to the first via pad 410, and the second wiring via 620 may electrically connect the signal pattern 520 to the second via 220. As a material of the first and second wiring vias 610 and 620, a metal material may be used. As the metal material, copper (Cu), aluminum (Al), silver (Ag), tin (Sn), gold (Au), nickel (Ni), lead (Pb), titanium (Ti), or alloys thereof may be used. The first and second wiring vias 610 and 620 may include a signal via, a ground via, a power via, and the like according to the design. For example, the first wiring via 610 connected to the ground pattern 510 may be a ground via, and the second wiring via 620 connected to the signal pattern 520 may be a signal. Each of the vias of the first and second wiring vias 610 and 620 may be completely filled with a via hole with a metal material, or the metal material may be formed along a wall surface of the via hole. The first and second wiring vias 610 and 620 may also be formed by plating processes such as an AP, a SAP, a MASP, TT, and the like, and may include a seed layer, an electroless plating layer, and an electrolytic plating layer formed based on the seed layer. The vias of each of the first and second wiring vias 610 and 620 may have a tapered shape in which a width of one surface is greater than a width of the other surface, and may have a tapered shape in a direction, opposite from the first and second wiring vias 610 and 620, located opposite with respect to the core layer 110. In the case of FIG. 3, only the first and second wiring vias 610 and 620 penetrating through the first and second insulating layers 120 and 130 are illustrated, but a larger number of insulating layers are stacked according to needs and designs. In this case, a larger number of wiring vias can be disposed accordingly.

FIG. 3 illustrates a structure in which a circuit pattern 500 of the printed circuit board 100A is disposed on an outermost layer, but if necessary, a passivation layer having an opening exposing at least a portion of the circuit pattern 500 of the outermost layer may further be disposed on the circuit pattern 500. The passivation layer may prevent the printed circuit board 100A from physical and chemical damages, and may include a photosensitive insulating material such as PID. An electrical connection metal may be disposed in the opening through which the circuit pattern 500 of the outermost layer is exposed. The electrical connection metal may be formed of tin (Sn) or an alloy containing tin (Sn), for example, solder, but is not limited thereto. The electrical connection metal may be a land, a ball, a pin, or the like, respectively.

Figure 4:
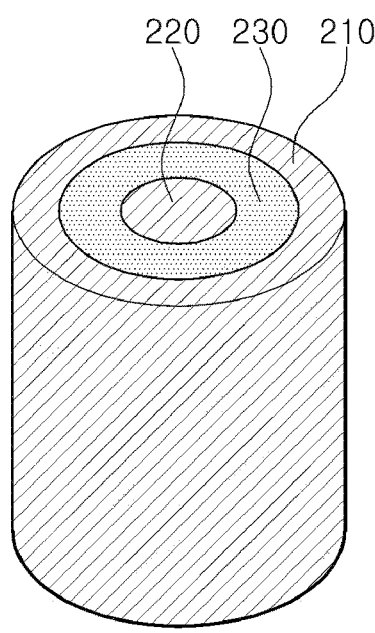
FIG. 4 is a schematic perspective view of a via member embedded in the printed circuit board of FIG. 3.

FIG. 4 is a schematic perspective view of a via member embedded in the printed circuit board of FIG. 3.

As shown in FIG. 4, a via member 200 may include a second via 220, a dielectric material 230 in contact with a side surface of the second via 220 and surrounding the side surface of the second via 220, and a first via 210 in contact with a side surface of the dielectric material 230 and surrounding side surfaces of the second via 220 and the dielectric material 230.

The via member 200 may not be formed by being plated on the core layer 110, and manufactured to have a size that can be inserted into a through-hole 110H of the core layer 110 through a separate manufacturing process. As described above, by separately forming the via member 200 in this way, a yield of the printed circuit board 100A may be improved, a degree of freedom of design may be secured, and characteristic impedance matching may be performed more efficiently.

With respect to diameters of the first and second vias 210 and 220, a diameter of the first via 210 may be greater than a diameter of the second via 220, and smaller than a diameter of the through portion 110H. As long as the above criteria are satisfied, the diameters of the first and second vias 210 and 220 are not limited. In the case of the second via 220, since it has a cylindrical shape, the diameter may mean the longest width among widths of a horizontal cross-section. In the case of the first via 210, it has a hollow cylinder, and may mean the longest width among the widths connecting points where an outer periphery of the first via 210 intersects a virtual straight line in a horizontal cross-section.

As shown in FIG. 4, the dielectric material 230 may be disposed between the first and second vias 210 and 220 to include a dielectric material having a specific dielectric constant and dielectric loss tangent for characteristic impedance matching, and the dielectric material may vary according to design and needs. As the via member 200 of the present disclosure has a structure as shown in FIG. 4, a degree of design freedom can be secured and it can be efficiently used for characteristic impedance matching between the first and second vias 210 and 220.

FIGS. 5 to 11 are process cross-sectional views schematically illustrating an example of manufacturing the printed circuit board of FIG. 3.

Figure 5:
FIGS. 5 to 12 are cross-sectional views schematically illustrating an example of manufacturing the printed circuit board of FIG. 3.
Figure 6:
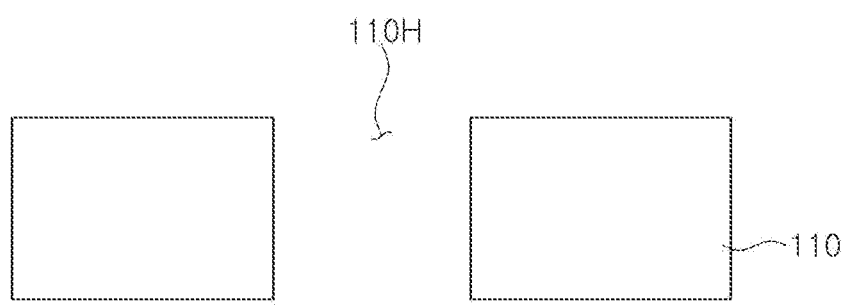

Referring to FIGS. 5 and 6, after preparing a core layer 110, a through portion 110H is formed in the core layer 110. Processing of the through portion 110H may be performed by a conventional processing method of the through portion such as a mechanical drilling process using a laser drilling process, a sandblasting process, or the like, but is not limited thereto.

Figure 7:
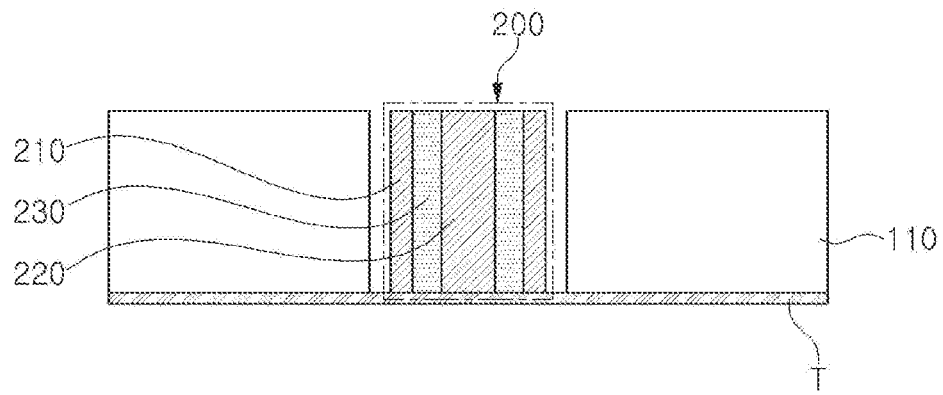

Referring to FIG. 7, after attaching a tape T to one surface of a core layer 110, a via member 200 is embedded in a through portion 110H. The via member 200 may be fixed in the through portion 110H due to the tape T, through which one surface of the via member 200 and the other surface of the core layer 110 may have a coplanar structure.

Figure 8:
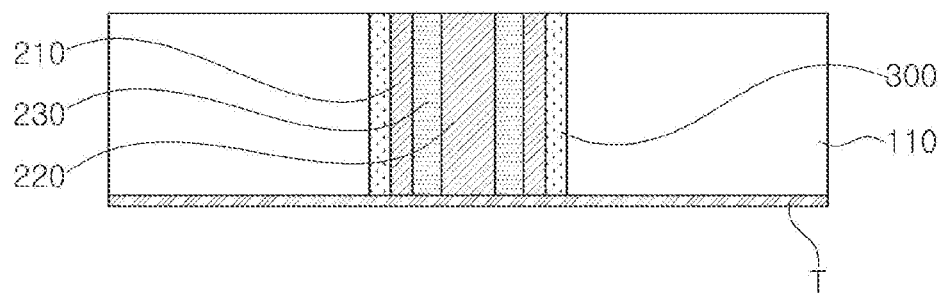

Referring to FIG. 8, an insulating material 300 may be filled in a through portion 110H. The insulating material 300 may be a thermosetting material in an uncured or semi-cured state, and may fill at least a portion of the through portion 110H and may be temporarily bonded to an inner wall of the core layer 110. Ina process of filling the insulating material 300, by heating the insulating material 300, adhesive force may be generated with the via member 200 and the core layer 110. In a heating process, viscosity may be imparted such that viscosity of the uncured insulating material 300 reaches the lowest viscosity state. Through a series of processes, after the insulating material 300 is disposed in the through portion 110H of the core layer 110, the insulating material 300 in an uncured or semi-cured state may be cured and fixed through a curing process.

Figure 9:
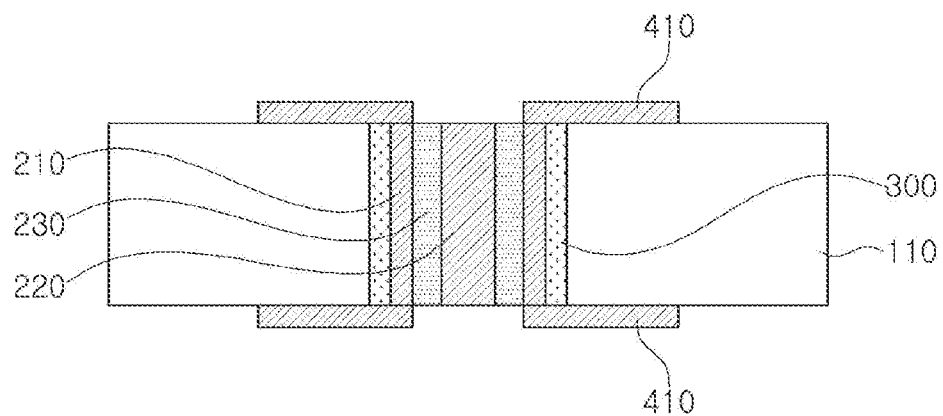

Referring to FIG. 9, after the tape T is peeled off, a first via pad 410 connected to a first via 210 may be formed on one surface and the other surface of the core layer 110. The first via pad 410 may be disposed using the above-described plating process, and the method thereof is not limited thereto. The first via pad 410 may be formed to be connected to the first via 210, but may not be connected to the second via 220. As a result, the first via pad 410 may have a ring shape having an opening region exposing the second via 220 in a central portion thereof.

Figure 10:
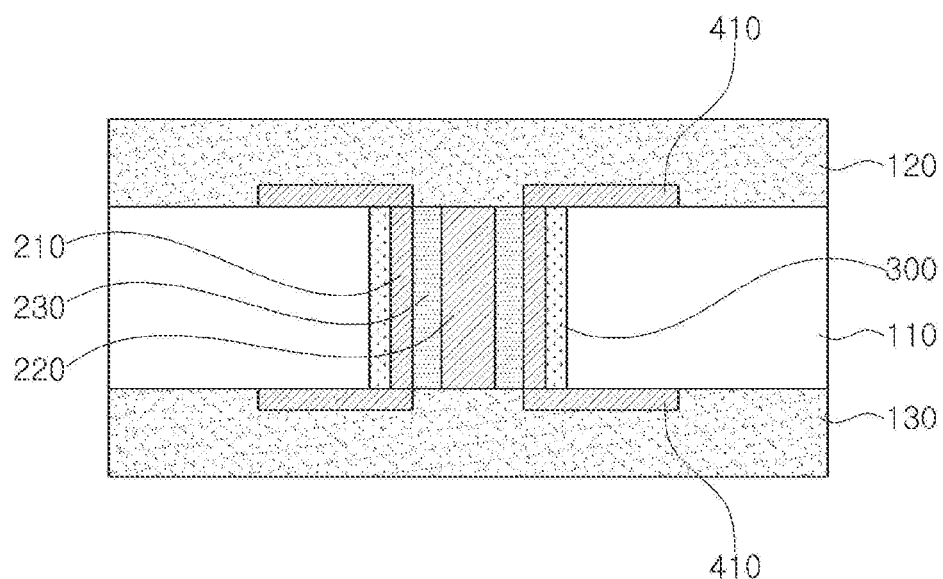
Figure 11:
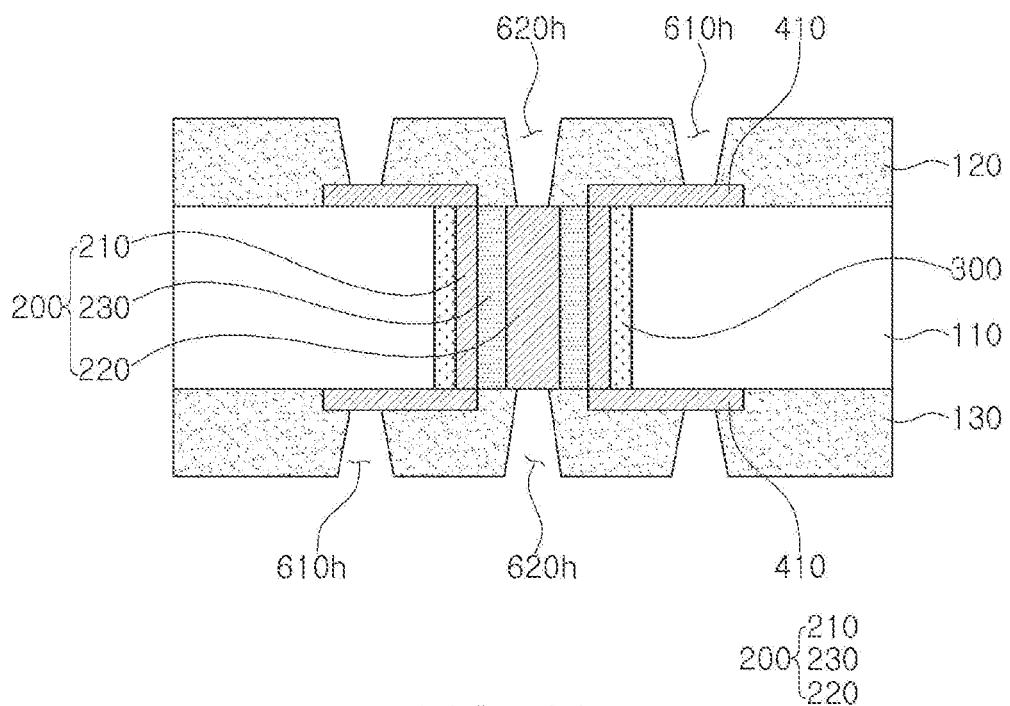

Referring to FIGS. 10 and 11, first and second insulating layers 120 and 130 may be stacked on one surface and the other surface of the core layer 110, and first and second wiring via holes 610h and 620h respectively exposing the first via pad 410 and the second via 220 may be formed.

Figure 12:
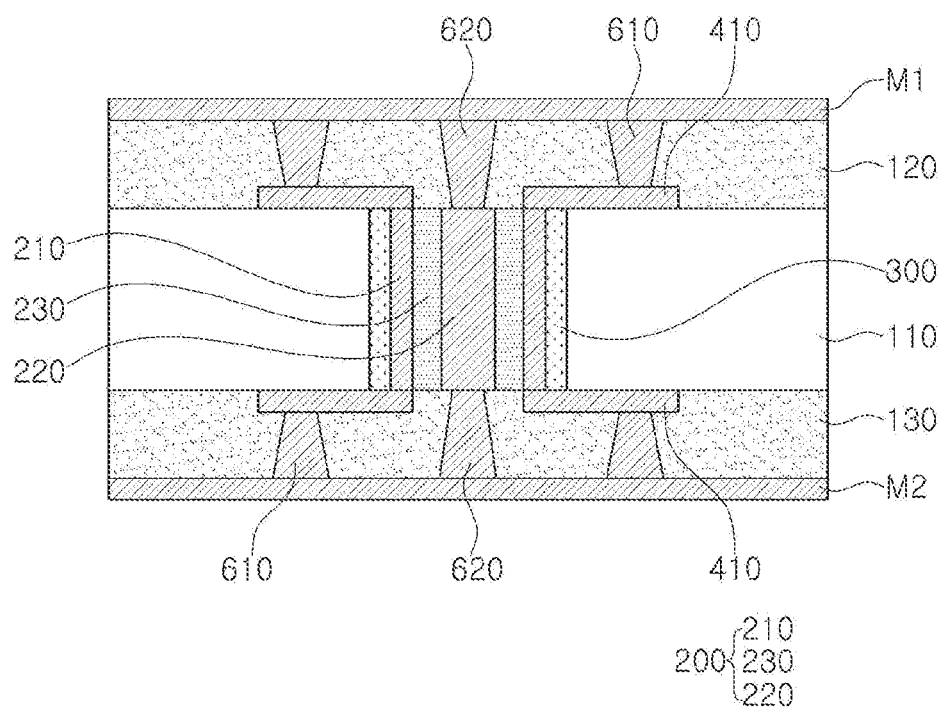

Referring to FIG. 12, metal layers M1 and M2 may be plated on the first and second insulating layers 120 and 130 using a conventional plating method, and the first and second wiring via holes 610h and 620h may be filled with a metal material. Thereafter, as the metal layers M1 and M2 are patterned, the printed circuit board 100A of FIG. 3 may be manufactured.

A printed circuit board 100A according to the above-described example may be manufactured through a series of processes, and other overlapping contents will be omitted.

Figure 13:
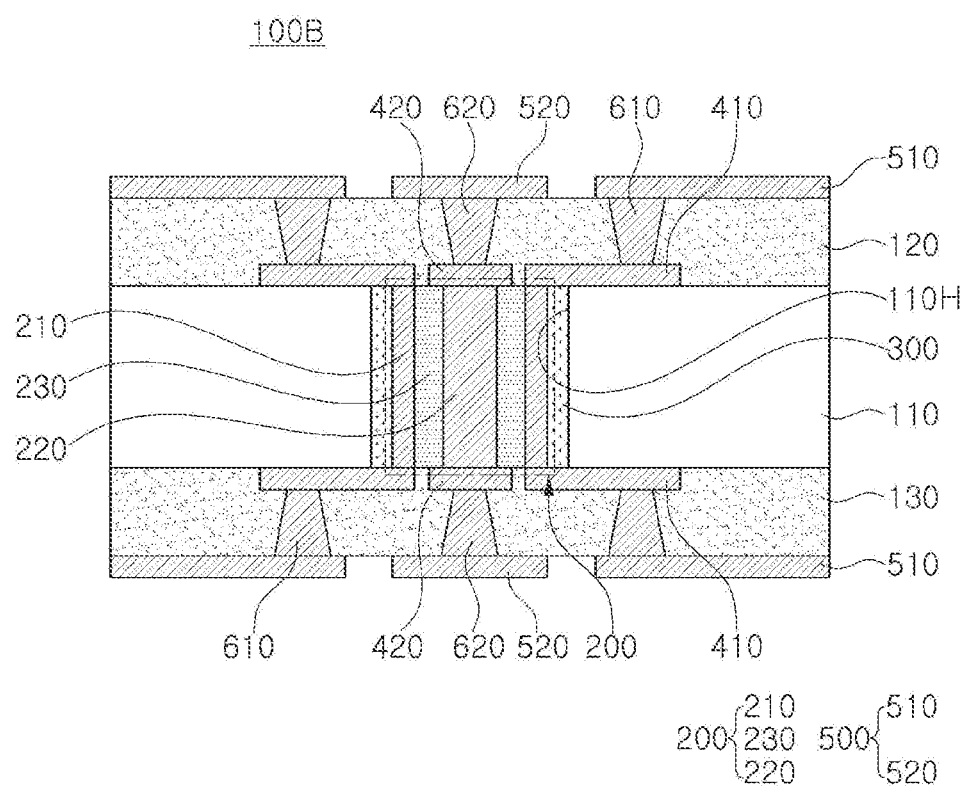
FIG. 13 is a cross-sectional view schematically illustrating another example of a printed circuit board.

FIG. 13 is a cross-sectional view schematically illustrating another example of a printed circuit board.

Referring to FIG. 13, as compared to the printed circuit board 100A according to the above-described example, in a printed circuit board 100B according to another example, a second via pad 420 connected to a second via 220 is additionally disposed on one surface and the other surface of a via member 200. In this case, the second via pad 420 may be disposed in an opening region of a central portion of the first via pad 410, and may be formed to be spaced apart from the first via pad 410 by a predetermined distance.

Specifically, as compared to the printed circuit board 100A according to the example, the printed circuit board 100B according to another example further includes a second via pad 420 having one surface in contact with the second via 220 and the other surface in contact with a second wiring via 620 and electrically connected.

The second via pad 420 may function as a pad for electrical signal transmission of the second via 220, which is a signal via, and may have a cylindrical shape unlike the first via pad 410 having a ring shape, and may cover one surface and the other surface of the second via 220.

As a material of the second via pad 420, the same material used as a material of the first via pad 410 may be used, but the material of the second via pad 420 does not have to be the same as the material of the first via pad 410. In addition, the second via pad 420 may be formed through a plating process together with a forming process of the first via pad 410.

In the printed circuit board 100B according to another example, the description of the remaining overlapping components except for the second via pad 420 may be equally applied to the description of the printed circuit board 100A according to the example.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of the various effects of the present disclosure, a printed circuit board having improved signal quality may be provided.

As another one of various effects of the present disclosure, a printed circuit board, advantageous for impedance matching, may be provided.

As another one of various effects of the present disclosure, a printed circuit board capable of preventing signal loss in a core layer may be provided.

As another one of various effects of the present disclosure, a printed circuit board in which a degree of design freedom is secured may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
   a core layer;
   a through portion penetrating through an upper surface and a lower surface of the core layer;
   a first via disposed to be spaced apart from an inner surface of the through portion within the through portion;
   a second via disposed inside the first via, and having a diameter, different from that of the first via;
   an insulating material disposed between the first via and the inner surface of the through portion; and
   a first via pad disposed on the first via,
   wherein the first via pad is in contact with the core layer, the insulating material, and the first via.

2. The printed circuit board of claim 1, wherein the insulating material is coplanar with one of the upper surface and the lower surface of the core layer.

3. The printed circuit board of claim 1, further comprising a dielectric material disposed between the first and second vias.

4. The printed circuit board of claim 3, wherein the dielectric material comprises a material, different from at least one of the core layer and the insulating material.

5. The printed circuit board of claim 1, wherein the core layer and the insulating material comprise materials different from each other.

6. The printed circuit board of claim 1, wherein the first via has a greater diameter than the second via.

7. The printed circuit board of claim 1, further comprising a second via pad disposed on the second via.

8. The printed circuit board of claim 1, further comprising an insulating layer disposed on the core layer;
a circuit pattern disposed on the insulating layer; and
first and second wiring vias penetrating through the insulating layer, and connecting the first and second vias to the circuit pattern, respectively.

9. The printed circuit board of claim 8, wherein the circuit pattern comprises a signal pattern and a ground pattern,
wherein the first via is connected to the ground pattern,
wherein the second via is connected to the signal pattern.

10. The printed circuit board of claim 9, wherein the first wiring via contacts the ground pattern and the first via pad,
wherein the second wiring via contacts the signal pattern and the second via.

11. The printed circuit board of claim 1, wherein the first via and the second via are coplanar with the one of the upper surface and the lower surface of the core layer.

12. A printed circuit board, comprising:
a core layer;
a through portion penetrating through an upper surface and a lower surface of the core layer;
a via member disposed within the through portion, and including first and second vias having diameters different from each other; and
an insulating material disposed in at least a portion of the through portion, and disposed between an inner wall of the through portion and the via member,
wherein the insulating material does not cover one of the upper surface and the lower surface of the core layer.

13. The printed circuit board of claim 12, wherein the first via is disposed to surround a side surface of the second via, and disposed to be spaced apart from the second via.

14. The printed circuit board of claim 13, further comprising a dielectric material disposed between the first and second vias, to cover at least a portion of the side surface of the second via.

15. The printed circuit board of claim 14, wherein at least two or more of the core layer, the insulating material, and the dielectric material comprise materials, different from each other.

16. A printed circuit board, comprising:
an insulating layer;
a through portion penetrating through an upper surface and a lower surface of the insulating layer;
a first via disposed in the through portion and spaced apart from the insulating layer by an insulating material; and
a second via disposed in the first via and spaced apart from the first via by a dielectric material,
wherein the insulating material does not cover one of the upper surface and the lower surface of the insulating layer.

17. The printed circuit board of claim 16, wherein the dielectric material comprises a material, different from at least one of the insulating layer and the insulating material.

18. The printed circuit board of claim 16, wherein the insulating layer and the insulating material comprise materials different from each other.

19. The printed circuit board of claim 16, further comprising a first via pad disposed on the first via and spaced apart from the second via.

20. The printed circuit board of claim 16, further comprising a second via pad disposed on the second via and spaced apart from the first via.

21. The printed circuit board of claim 16, wherein the insulating layer, the first via, the second via, the insulating material, and the dielectric layer are coplanar with each other on the one of the upper surface and the lower surface of the insulating layer.

* * * * *